(12) United States Patent
Ching et al.

(10) Patent No.: US 9,941,279 B2
(45) Date of Patent: Apr. 10, 2018

(54) SEMICONDUCTOR STRUCTURE HAVING FINS AND METHOD FOR MANUFACTURING THE SAME

(71) Applicant: TAIWAN SEMICONDUCTOR MANUFACTURING CO., LTD., Hsinchu (TW)

(72) Inventors: Kuo-Cheng Ching, Hsinchu County (TW); Shi-Ning Ju, Hsinchu (TW); Chih-Hao Wang, Hsinchu County (TW); Ying-Keung Leung, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 2 days.

(21) Appl. No.: 15/226,007

(22) Filed: Aug. 2, 2016

(65) Prior Publication Data

US 2017/0338225 A1    Nov. 23, 2017

Related U.S. Application Data

(60) Provisional application No. 62/340,030, filed on May 23, 2016.

(51) Int. Cl.
*H01L 21/308* (2006.01)
*H01L 21/8234* (2006.01)
*H01L 29/78* (2006.01)
*H01L 27/088* (2006.01)
*H01L 29/06* (2006.01)
(Continued)

(52) U.S. Cl.
CPC ...... *H01L 27/0886* (2013.01); *H01L 21/3065* (2013.01); *H01L 21/3085* (2013.01); *H01L 21/3086* (2013.01); *H01L 21/76224* (2013.01); *H01L 21/823431* (2013.01); *H01L 21/823481* (2013.01); *H01L 27/088* (2013.01); *H01L 27/108* (2013.01); *H01L 29/0649* (2013.01); *H01L 29/0653* (2013.01)

(58) Field of Classification Search
CPC . H01L 27/0886; H01L 27/088; H01L 27/108; H01L 21/76224; H01L 21/823431; H01L 21/823481; H01L 21/3065; H01L 21/3085; H01L 21/3086; H01L 29/0649; H01L 29/785; H01L 29/0653; H01L 29/66; H01L 29/66795
USPC ................ 257/397, 401, 506, 751, E21.409, 257/E21.546, E21.625, E21.628, E27.06, 257/E29.02, E23.01, E23.011; 438/283, 438/296, 424, 585, 700, 702
See application file for complete search history.

(56) References Cited

U.S. PATENT DOCUMENTS 9,455,176 B2 *  9/2016  Tsao .................... H01L 29/0653
9,530,868 B2 * 12/2016  Huang ................ H01L 21/3065
(Continued)

*Primary Examiner* — Dao H Nguyen
(74) *Attorney, Agent, or Firm* — McClure, Qualey & Rodack, LLP

(57) ABSTRACT

A semiconductor structure includes a substrate, at least one active fin present on the substrate, and at least one isolation dielectric surrounding the active fin. The isolation dielectric has at least one trench therein. The semiconductor structure further includes at least one dielectric liner present on at least one sidewall of the trench of the isolation dielectric, and at least one filling dielectric present in the trench of the isolation dielectric.

20 Claims, 8 Drawing Sheets

(51) Int. Cl.
*H01L 21/762* (2006.01)
*H01L 27/108* (2006.01)
*H01L 21/3065* (2006.01)

(56) References Cited

U.S. PATENT DOCUMENTS

| | | | | |
|---|---|---|---|---|
| 2013/0045580 A1* | 2/2013 | Cho | ............... | H01L 21/823431 |
| | | | | 438/296 |
| 2013/0277759 A1* | 10/2013 | Chen | ............... | H01L 21/823431 |
| | | | | 257/397 |
| 2014/0203376 A1* | 7/2014 | Xie | .................. | H01L 21/76224 |
| | | | | 257/401 |
| 2015/0340238 A1* | 11/2015 | Xie | .................... | H01L 29/0692 |
| | | | | 438/702 |
| 2016/0218042 A1* | 7/2016 | Ching | ................ | H01L 29/1054 |
| 2017/0213741 A1* | 7/2017 | Cheng | ................ | H01L 21/3086 |

* cited by examiner

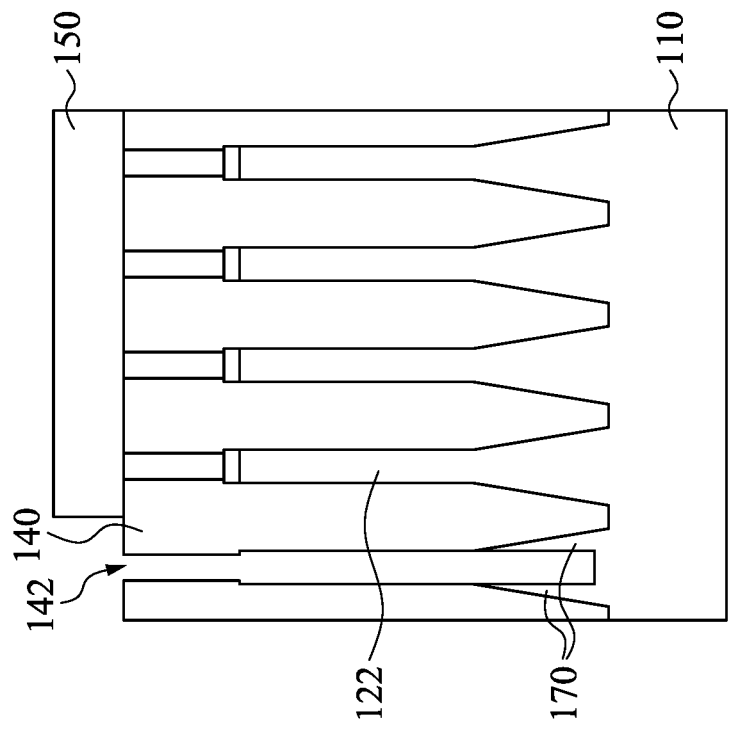
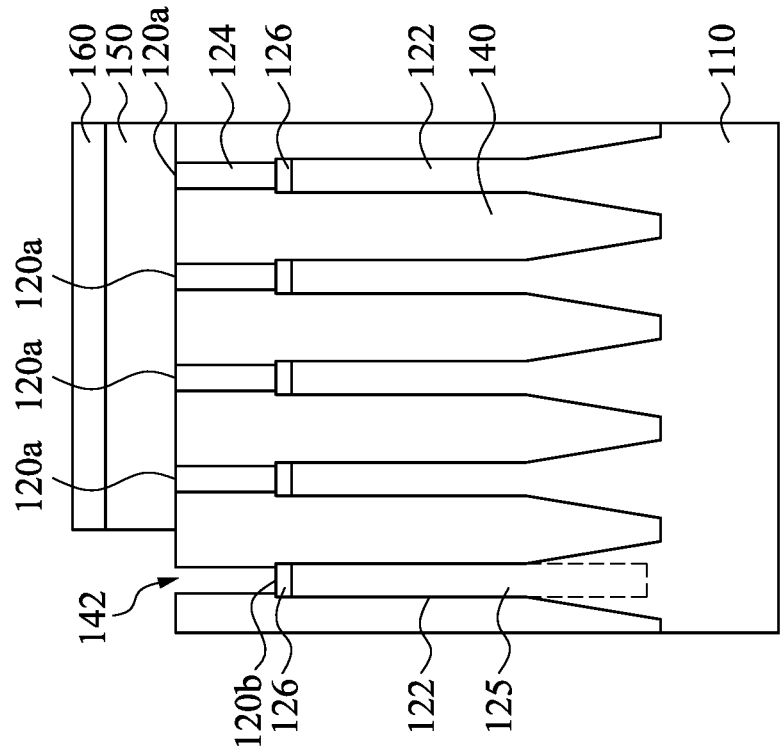

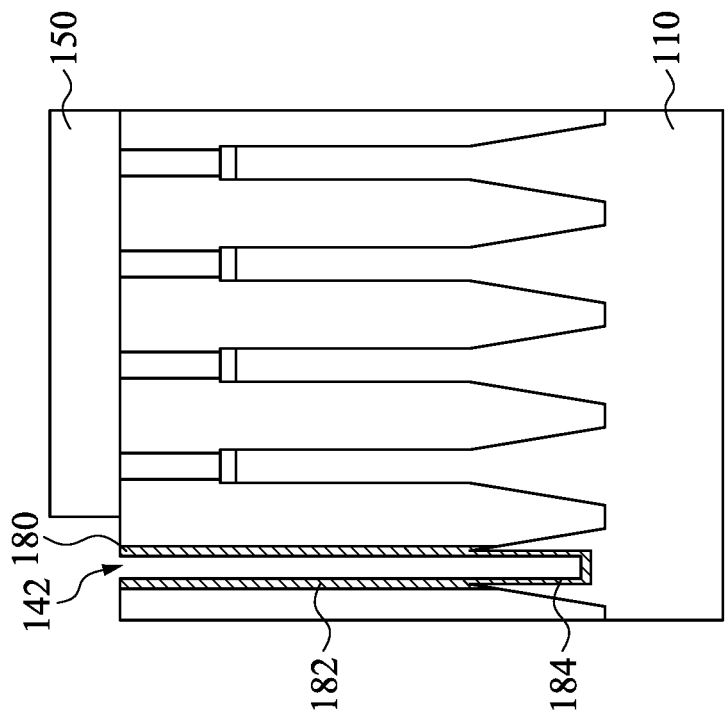
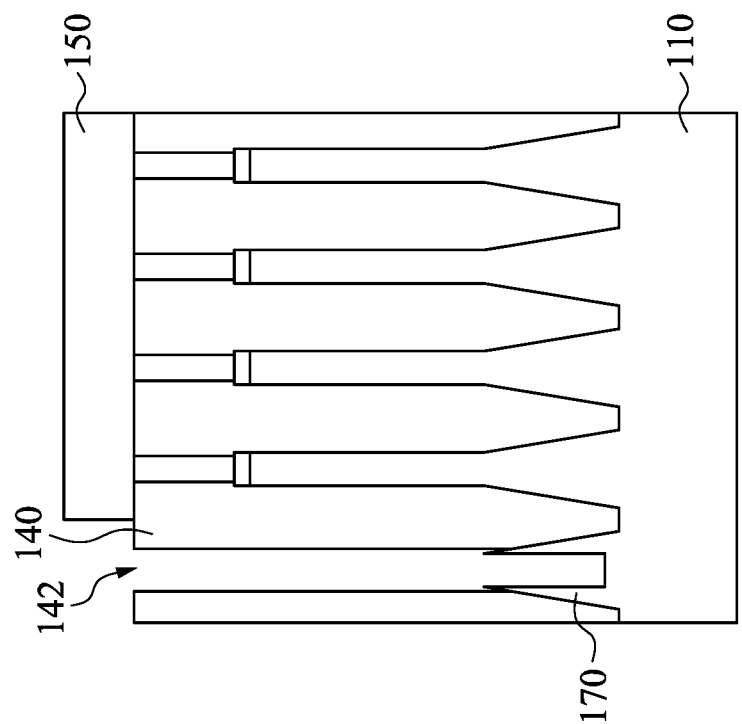

SEMICONDUCTOR STRUCTURE HAVING FINS AND METHOD FOR MANUFACTURING THE SAME

CROSS-REFERENCE TO RELATED APPLICATION

This application claims priority to U.S. Provisional Application Ser. No. 62/340,030, filed May 23, 2016, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Since the fins of FinFETs become thinner and thinner, the processing steps used to fabricate the FinFETs may produce undesirable and unintended consequences. For example, the outermost fins in a FinFET may bend or bow outwardly after some thermal annealing processes such as isolation oxide curing and consolidation due to the different and non-balanced stress applied to the inner fins and outer fins of a FinFET, which changes the fin pitch between fins and degrades yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 11 are cross-sectional views of different stages of a method of manufacturing a semiconductor structure having fins, in accordance with some embodiments of the disclosure.

DETAILED DESCRIPTION

Figure 2:
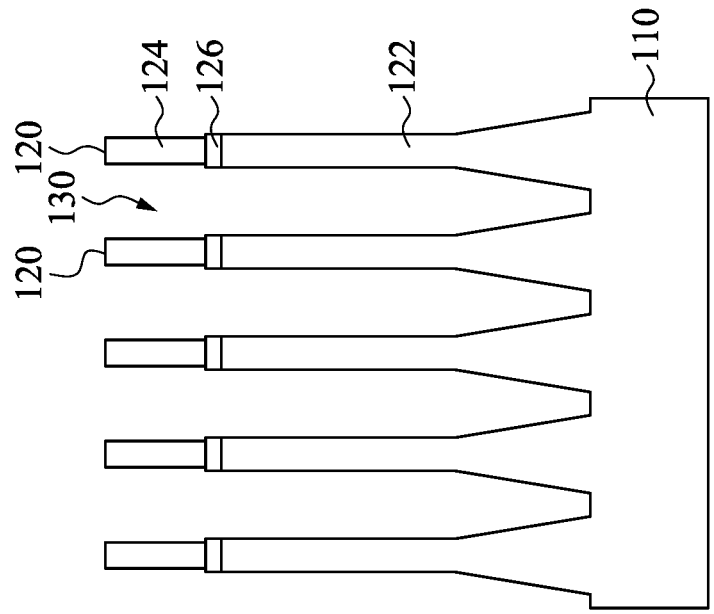

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is described with respect to embodiments in a fin scheme FinFET. The disclosure may also be applied, however, to other integrated circuits, electronic structures, and the like.

Figure 1:
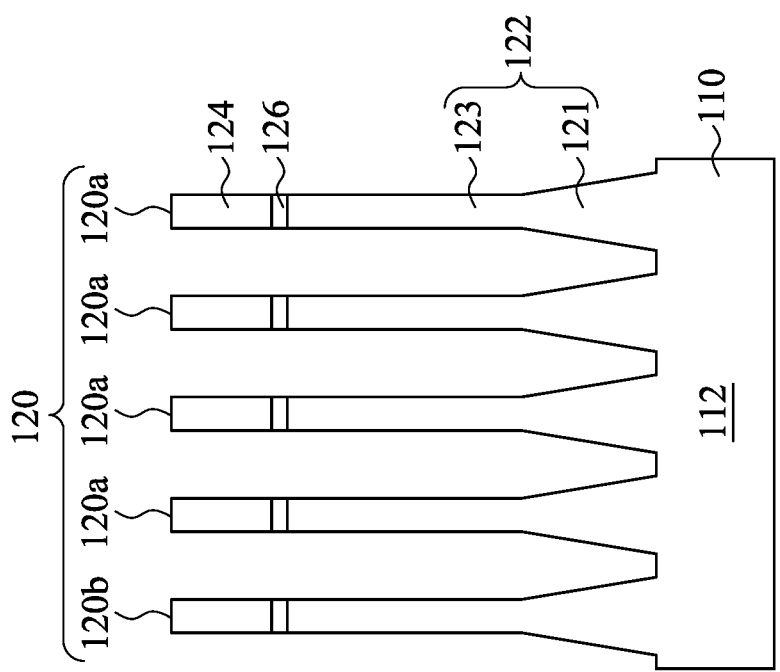

FIG. 1 to FIG. 11 are cross-sectional views of different stages of a method of manufacturing a semiconductor structure having fins, in accordance with some embodiments of the disclosure. Referring to FIG. 1, a plurality of fins 120 are present on a semiconductor substrate 110. The semiconductor substrate 110 may be bulk silicon, germanium, silicon germanium, a silicon-containing material, silicon-on-insulator (SOI), or another suitable semiconductor material. In some embodiments, the semiconductor substrate 110 may be doped with a P-type or n-type impurity. For example, the semiconductor substrate 110 may include a well 112 having a doping type. In some embodiments, the well 112 is a p-well. In some other embodiments, the well 112 is an n-well.

The fins 120 projects upwardly from the well 112. In some embodiments, the fins 120 with the p-type doping well 112 will form an n-type channel FinFET in later process steps. In some other embodiments, the fins 120 with the n-type doping well 112 will form a p-type channel FinFET in later process steps. As shown, the group of fins 120 includes four active fins 120a and one isolation fin 120b (which may also be referred to as dummy fins, and so on). While four total active fins 120a and one isolation fin 120b are illustrated in FIG. 1, it should be recognized that practical applications may incorporate more or fewer active and/or isolation fins.

Each of the fins 120 has a semiconductor strip 122 standing on the semiconductor substrate 110. The semiconductor strip 122 may include silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Each of the fins 120 further includes a hard mask layer 124 and an oxide layer 126 formed between the hard mask layer 124 and the semiconductor strip 122. The hard mask layer 124 can be made of nitride material. In some embodiments, the hard mask layer 124 is made of silicon nitride. The oxide layer 126 can be a pad oxide layer.

The fins 120 may be fabricated using suitable processes including photolithography and etch processes. The photolithography process may include forming a photoresist layer (resist) overlying the substrate 110 having lamination of semiconductor layers thereon, exposing the resist to a pattern, performing post-exposure bake processes, and developing the resist to form a masking element including the resist. The masking element is then used for etching recesses into the substrate 110, leaving the fins 120 on the substrate 110. The etching process can include dry etching, wet etching, reactive ion etching (RIE), and/or other suitable processes. Alternatively, the fins 120 may be formed by double-patterning lithography (DPL) process. Numerous other embodiments of methods to form the fins 120 on the substrate 110 may be suitable.

In some embodiments, the active fins 120a and the isolation fin 120b are fabricated simultaneously by using substantially the same processes. The profile of the active fins 120a is substantially the same as the profile of the isolation fin 120b. The profile of the fins 120 may be varied due to the recipes and the parameters utilized in the photolithography and etch processes. For example, each of the semiconductor strips 122 have a bottom portion 121 and the top portion 123, in which the bottom portion 121 is connected to the semiconductor substrate 110 and is present between the top portion 123 and the semiconductor substrate 110, and the bottom portion 121 is wider than the top portion 123. In some embodiments, the top portion 121 has substantially uniform width, and the width of the bottom portion is increasing from the end adjacent the top portion 123 to the end adjacent the semiconductor substrate 110. Namely, the bottom portion 121 may have a trapezoid or a triangle profile. In each of the fins 120, the width of the hard mask layer 124 is substantially the same as the width of the oxide layer 126, which is also substantially the same as the width of the top portion 123 of the semiconductor strip 122.

Reference is made to FIG. 2. A trimming process is performed on the hard mask layer 124 to remove portions of the segments of the hard mask layer 124. The trimming process may include exposing the hard mask layer 124 in the etching agent in an isotropic manner. In some embodiments, the etching agent may include oxygen ($O_2$). The trimming process has selectivity between the hard mask layer 124 and the underlying oxide layer 126, such that the oxide layer 126 can be regarded as a shielding to protect the semiconductor strips 122 when the hard mask layer 124 is trimmed. After the trimming is performed, the hard mask layer 124 becomes thinner than the underlying oxide layer 126 and the semiconductor strip 122. Therefore, the pitch between adjacent two segments of the hard mask layer 124 is wider than the pitch between adjacent two of the semiconductor strips 122. In some embodiments, a plurality of trenches 130 is present between the fins 120, and the trenches 130 have wider openings at the top and have narrower openings at the bottom.

Figure 3:
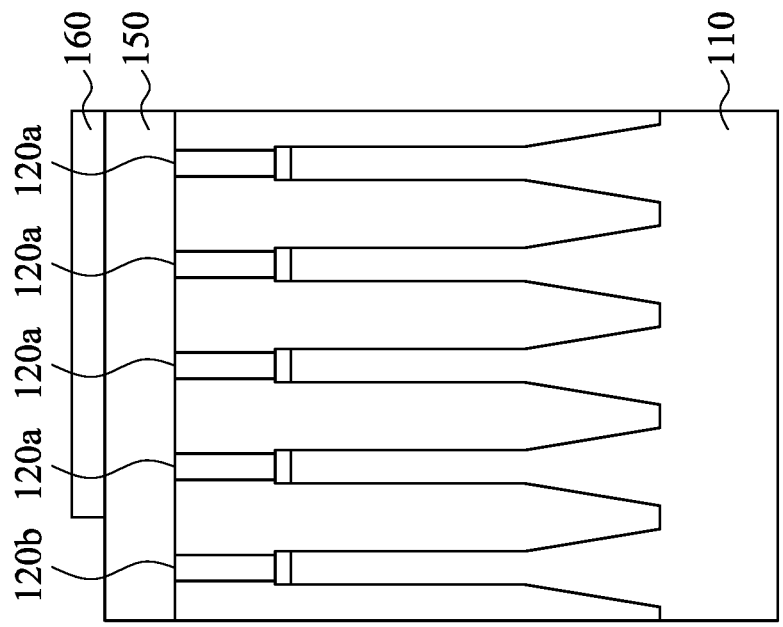

Reference is made to FIG. 3. A dielectric material is filled in the trenches 130 to form isolation dielectric 140 between the fins 120. For example, a flowable chemical vapor deposition (FCVD) process is frequently used to form isolation dielectric 140. In the FCVD process, a flowable dielectric material (such as a liquid compound) is deposited on the semiconductor substrate 110 and is able to fill the trenches 140 between the fins 120. A subsequent annealing process is performed to convert the flowable dielectric material to a solid dielectric material. In some embodiments, the annealing process is performed at a high temperature for a prolonged period (e.g., at 650° C. for about one to two hours) in order to form a dense solid dielectric material layer desirable for subsequent manufacturing processes. However, it has been found that such annealing process may occur unwanted fin collapse or bending due to the different and non-balanced stress applied to the active fins 120a and isolation fin 120b.

The solid dielectric material layer can be planarized, for example, by chemical mechanical polishing (CMP) with the CMP stopping on the hard mask layer 124. The CMP process and specifically the slurry employed in the planarization are adjusted to selectively stop on the hard mask material, such as silicon nitride.

Figure 4:
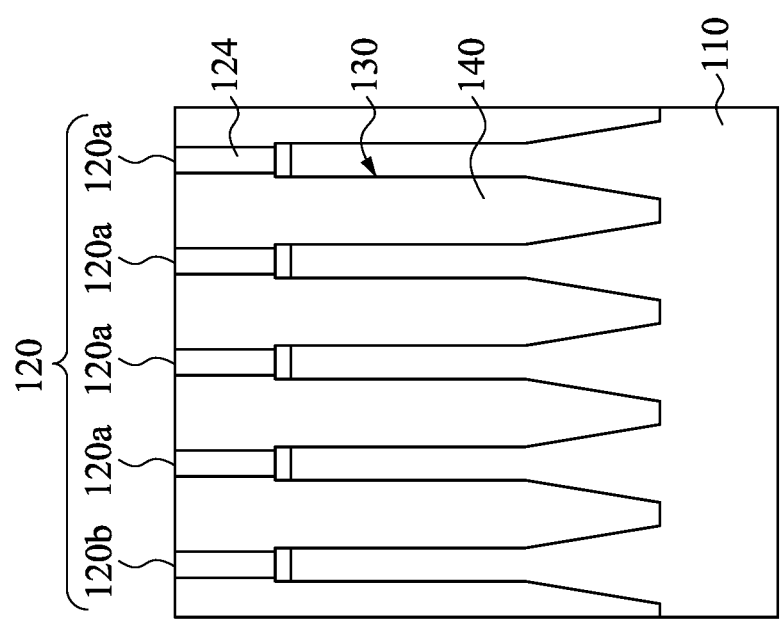

Reference is made to FIG. 4. An additional oxide layer 150 and a photoresist layer 160 are sequentially formed on the semiconductor substrate 110 by any suitable deposition processes. In some embodiments, the oxide layer 150 is present on the semiconductor substrate 110 and covers all of the active fins 120a and the isolation fin 120b. The photoresist layer 160 is patterned and covers all of the active fins 120a. Namely, the isolation fin 120b, which is the outmost fins among the fins 120, and the portion of the oxide layer 150 above the isolation fin 120b is exposed from the photoresist layer 160.

Reference is made to FIG. 5. The portions the oxide layer 150 and the hard mask layer 124 exposed from the photoresist layer 160 are removed. For example, the removing process may include one or more etch processes. In some embodiments, the etchant for removing the hard mask layer 124 has selectivity between the hard mask layer 124 and the underlying oxide layer 126, such that the process of removing the hard mask layer 124 is stopped at the oxide layer 124, and a trench 142 is formed in the isolation dielectric 140 after the hard mask layer 124 is removed. In some embodiments, the oxide layer 126 can be utilized as an etch stop layer. In some embodiments, the portion of hard mask layer 124 at the isolation fin 120b is removed, and the portions of the hard mask layer 124 at the active fins 120a are still covered by the photoresist layer 160.

A self-aligned cutting process is performed to remove a portion 125 of the semiconductor strip 122 of the isolation fin 120b while remaining at least a pair of fin residues 170 on the substrate 110. For example, the portion 125, which is removed from the isolation fin 120b, aligns the oxide layer 126. Namely, the structural alignment between two features, such as the portion of the oxide layer 126 at the isolation fin 120b and the portion 125 at the isolation fin 120b, which lack overlay or misregistration tolerances inherent between features formed with separate masking levels. In some embodiments, the width of the removing portion 125 is substantially the same as the width of the portion of the oxide layer 126 at the isolation fin 120b. The portion of the semiconductor strip 122 align with the portion of the oxide layer 126 (e.g., the portion 125) is removed, and the portions of the semiconductor strips 122 not overlapped by the oxide layer 126 still remain in the isolation dielectric 140, as shown in FIG. 6. In some embodiments, the oxide layer 126 of the isolation fin 120b can be removed with the portion 125 simultaneously. In some other embodiments, the oxide layer 126 of the isolation fin 120b and the portion 125 are removed sequentially.

Reference is made to both FIG. 5 and FIG. 6. After the portion of the oxide layer 126 and the portion 125 of the semiconductor strip 122 at the isolation fin 120b are removed, the trench 142 is extended to the bottom of the isolation dielectric 140. The residues of the semiconductor strip 122 form a plurality of fin residues 170 at the bottom of the isolation dielectric 140. The fin residues 170 are monolithically connected to the substrate 110. The fin residues 170 are lower than the semiconductor strips 122. The fin residues 170 are present in opposite sides of the sidewall of the trench 142 of the isolation dielectric 140. The fin residues 170 are located in the isolation dielectric 140, and sidewalls of the fin residues 170 are exposed from the isolation dielectric 140. In some embodiments, the fin residues 170 are the residues of the bottom portion 121 (referring to FIG. 1) of the semiconductor strip 122.

In some embodiments, the fin residues 170 are arranged symmetrically with respect to a central axis of the trench 142. The bottom of each of the fin residues 170 is wider than the top of each of the fin residues 170. In some embodiments, each of the fin residues 170 may have a substantially triangle cross section. In some embodiments, the fin residues 170 are arranged in pair, and the pair of the fin residues 170 are connected at the bottom of the trench 142, for example, a thin fin residue covers the substrate 110 and connects the fin residues 170. In some other embodiments, the fin residues 170 are arranged in pair, and the pair of the fin residues 170 are spaced apart, in which a portion of the substrate 110 is exposed from the trench 142.

Reference is made to FIG. 7. A portion of the isolation dielectric 140 is removed, such that the trench 142 is enlarged. In some embodiments, an etch back process is performed to enlarge the trench 142 in the isolation dielectric 140. The width of the trench 142 is enlarged. In some embodiments, the width of the trench 142 before performing the etch back process is about 15 nm, and the width of the trench 142 becomes about 16-18 nm after the trench 142 is enlarged by the etch back process. The etchant for removing the portion of the isolation dielectric 140 has selectivity between the isolation dielectric 140 and the fin residues 170, such that fin residues 170 remains standing on the substrate 110 after the trench 140 is enlarged. In some embodiments, portions of the fin residues 170 are exposed from the trench 142 and are protruded from the isolation dielectric 140, and the fin residues 170 are substantially remained in the isolation dielectric 140.

Reference is made to FIG. 8. A dielectric liner 180 is present on the sidewalls of the trench 142 of the isolation dielectric 140. The dielectric liner 180 can be formed by any suitable deposition process, such as an ALD process, a CVD process, or a PVD process. The dielectric liner 180 and the isolation dielectric 140 are made of different materials. The dielectric liner 180 can be made of nitride material. In some embodiments, the dielectric liner 180 is deposited on the sidewalls of the trench 142 and covers the exposed portions of the fin residues 170, thus the fin residues 170 are present between the dielectric liner 180 and the isolation dielectric 140.

In some embodiments, the dielectric liner 180 is extending from the substrate 110. The dielectric liner 180 includes a bottom segment 182 covering the fin residues 170, and two sidewall segments 184 extended from the bottom segment 182.

Figures 9, 10:
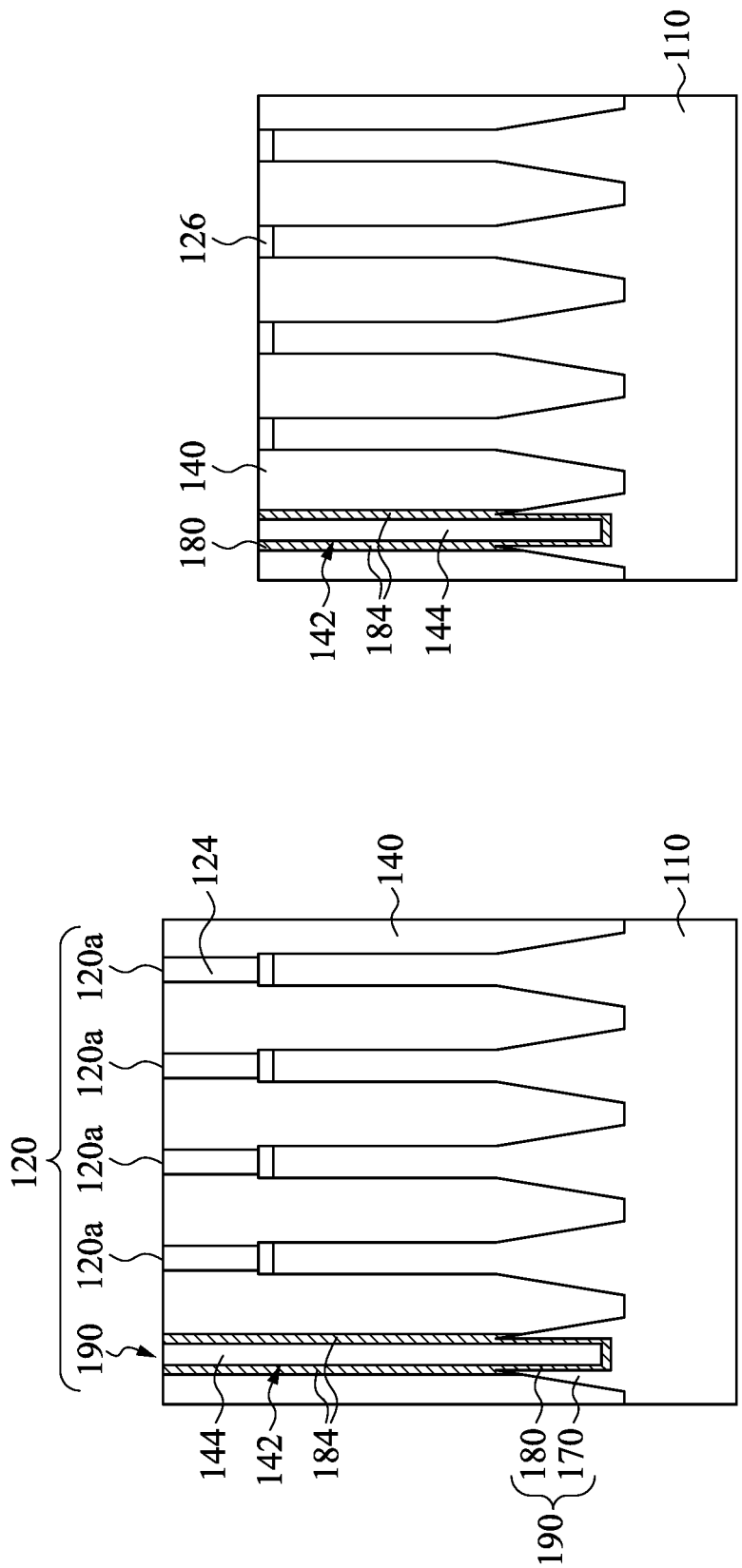

Reference is made to FIG. 9. A filling dielectric 144 is filled in the trench 142. The filling dielectric 144 fills the trench 142 between the sidewall segments 184 of the dielectric liner 180. For example, a FCVD process is frequently used to fill the dielectric material in the trench 142. In the FCVD process, the flowable dielectric material, which is substantially the same as the material of the isolation dielectric 140 is deposited and fills the trench 142. A subsequent annealing process is performed to convert the flowable dielectric material to a solid dielectric material. In some embodiments, the annealing process is performed at a high temperature for a prolonged period (e.g., at 650° C. for about one to two hours) in order to form a dense solid dielectric material layer desirable for subsequent manufacturing processes. The filling dielectric 144 can be planarized, for example, by chemical mechanical polishing with the CMP stopping on the hard mask layer 124. The CMP process and specifically the slurry employed in the planarization are adjusted to selectively stop on the hard mask material, such as silicon nitride. In some embodiments, the oxide layer 150 (referring to FIG. 8) is also removed while the exceed portion of the dielectric material is removed.

In some embodiments, the dielectric liner 180, the fin residues 170, and the filling dielectric 144 filled in the trench 142 construct a dummy fin 190. The dummy fin 190 is disposed next to the active fins 120a. In some embodiments, the dummy fin 190 is regarded as the outmost fin among a group of the fins 120. Since the dielectric liner 180 is made of substantially hard material, such as silicon nitride, the strength of the dummy fin 190 is stronger than the isolation fin 120b (referring to FIG. 3). Therefore, the problem of the unwanted fin collapse or bending due to the different and non-balanced stress during the annealing process can be prevented. In some embodiments, the dummy fin 190 not only enhances the structure strength, but also blocks the moisture and oxygen from entering the device.

Reference is made to FIG. 10. In some embodiments, the isolation dielectric 140 and the filling dielectric 144 are etched back, and a portion of the dielectric liner 180 and the hard mask layer 124 (referring to FIG. 9) are further removed. The dielectric liner 180 and the hard mask layer 124 can be removed simultaneously. In some other embodiments, a planarization process is performed to remove the portions of the isolation dielectric 140, the filling dielectric 144, the dielectric liner 180, and the hard mask layer 124. The planarization process can be a CMP process, and the CMP process is stopped at the oxide layer 126.

Figure 11:
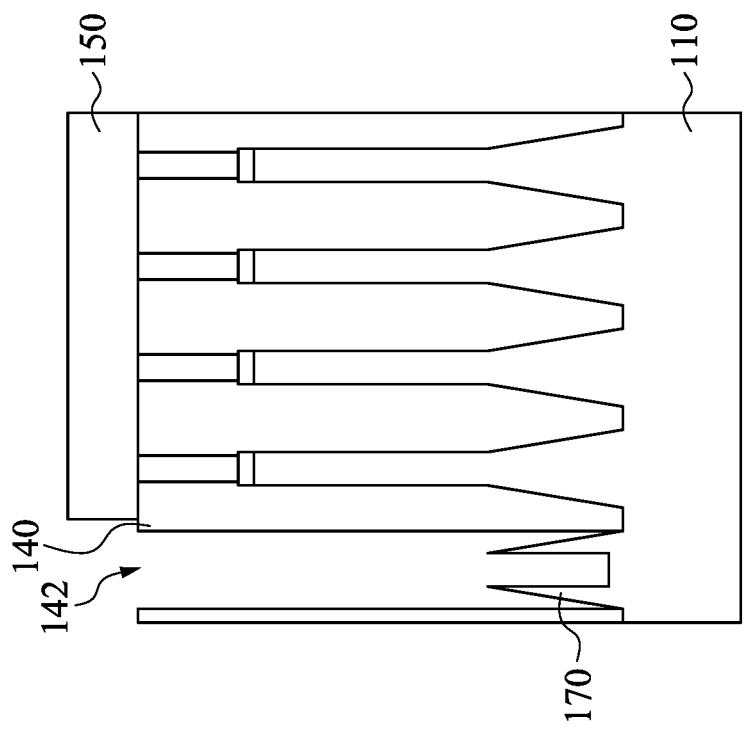

Reference is made to FIG. 11. A recessing process is performed to expose the active fins 120a. A portion of the isolation dielectric 140 is etched away to expose an upper portion of each of the active fins 120a. The dummy fin 190 is cut away since the dummy fin 190 is not electrically necessary. In some embodiments, the dummy fin 190 is lower than the active fins 120a. In the direction parallel to the fins 120, the dummy fin is removed to provide isolation between transistors of opposite polarity. In the direction perpendicular to the fins 120, the dummy fin 190 is removed to provide isolation between transistors of the same polarity.

In some embodiments, the height H1 of the fin residues 170 in the dummy fin 190 is in a range from about 3 nm to about 15 nm. The height H2 of the active fins 120a is about 120 nm. The thickness of the dielectric liner 180 is about 2 nm to about 5 nm. The pitch between adjacent two of the active fins 120a is less than 30 nm. The height H3 of the remaining isolation dielectric 140 is in a range from about 60 nm to about 70 nm.

Reference is made to FIG. 12 to FIG. 16, in which FIG. 12 to FIG. 16 are cross-sectional views of different stages of a method of manufacturing a semiconductor structure having fins, in accordance with some other embodiments of the disclosure. The stage of FIG. 12 follows the stage disclosed in FIG. 6, in which the portion of the semiconductor strip 122 of the isolation fin 120b is removed, thereby forming the trench 142 in the isolation dielectric 140. The previous stages to form such structure are similar to that shown in FIGS. 1 to 6, and therefore is not repeated here to avoid duplicity.

Figure 12:
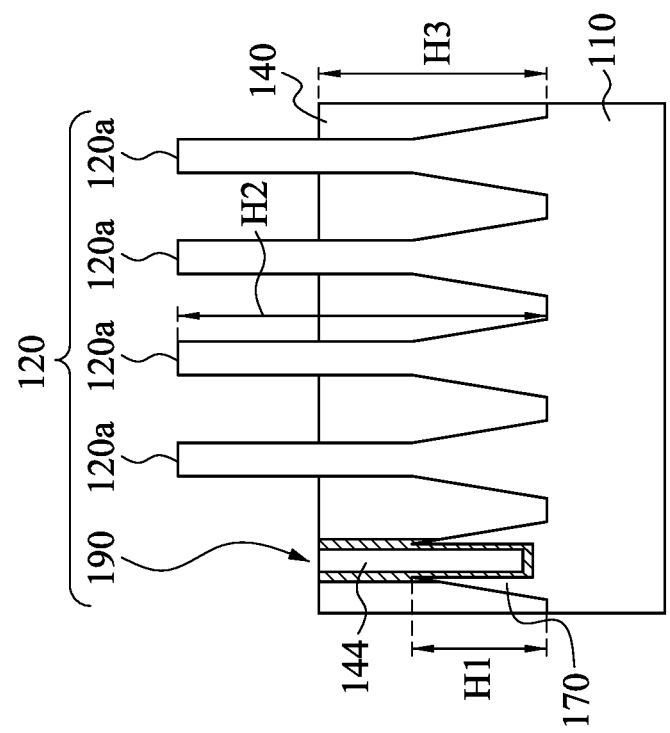
FIGS. 12 to 16 are cross-sectional views of different stages of a method of manufacturing a semiconductor structure having fins, in accordance with some other embodiments of the disclosure.

Referring to FIG. 12, the isolation dielectric 140 is etched back to enlarge the trench 142. The etchant for removing the portion of the isolation dielectric 140 has selectivity between the isolation dielectric 140 and the fin residues 170, such that fin residues 170 remains standing on the substrate 110 after the trench 140 is enlarged. In some embodiments, the trench 142 is enlarged to expose entire of the fin residues 170. The opposite sidewalls of fin residues 170 are substantially exposed from the trench 142 and are not covered by the isolation dielectric 140 after the trench 142 is enlarged. Namely, the fin residues 170 are present on the substrate 110 and are isolated from isolation dielectric 140.

In some embodiments, the bottom of each of the fin residues 170 is wider than the top of each of the fin residues 170. In some embodiments, each of the fin residues 170 may have a substantially triangle cross section. In some embodiments, the fin residues 170 are arranged in pair, and the fin residues 170 are arranged substantially symmetrically with respect to a central axis of the trench 142.

Figure 13:
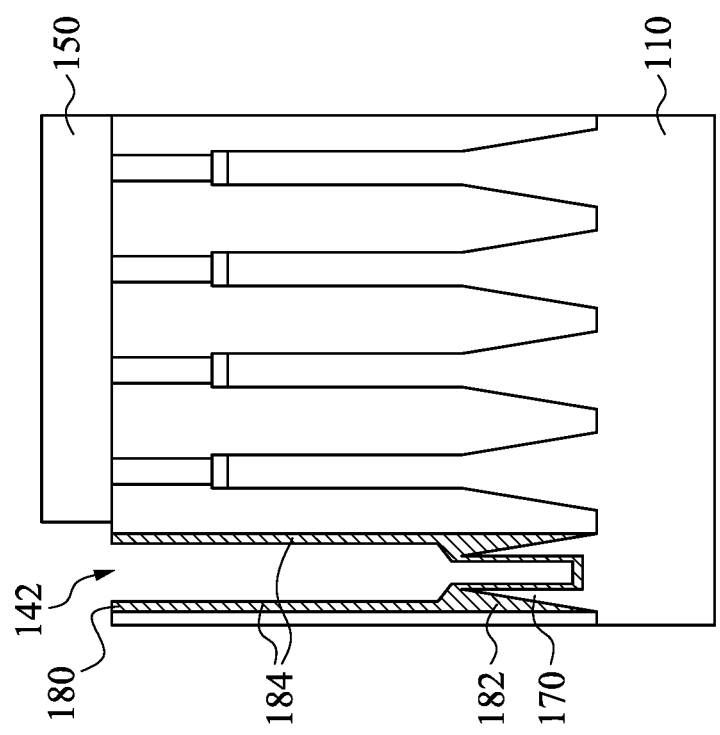

Reference is made to FIG. 13. A dielectric liner 180 is formed in the trench 142. The dielectric liner 180 can be formed by any suitable deposition process, such as an ALD process, a CVD process, or a PVD process. The dielectric liner 180 and the isolation dielectric 140 are made of different materials. The dielectric liner 180 can be made of nitride material. The dielectric liner 180 is deposited on the sidewalls of the trench 142 and covers the fin residues 170. In some embodiments, the dielectric liner 180 is extending from the substrate 110. The dielectric liner 180 includes a bottom segment 182 covering the fin residues 170, and two sidewall segments 184 extended from the bottom segment 182. In some embodiments, the bottom segment 182 of the dielectric liner 180 is deposited on the opposite sidewalls of each of the fin residues 170, and bottom segment 182 of the dielectric liner 180 also fills the gap between the fin residues 170 and the isolation dielectric 140.

Figure 14:
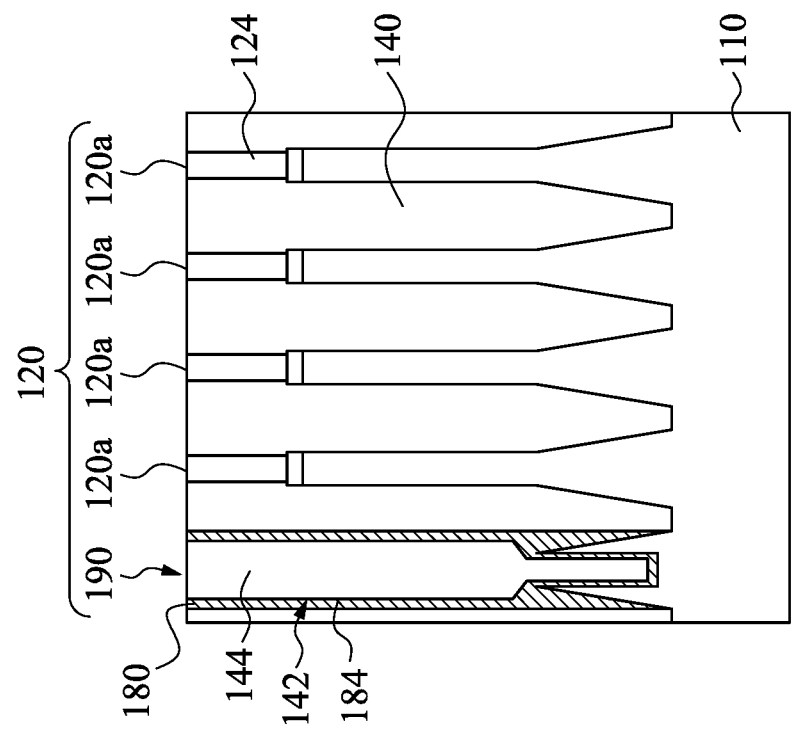

Reference is made to FIG. 14. A filling dielectric 144 is filled in the enlarged trench 142. The filling dielectric 144 fills the trench 142 between the sidewall segments 184 of the dielectric liner 180. For example, a FCVD process is frequently used to fill the filling dielectric 144 in the trench 142. In the FCVD process, the flowable dielectric material, which is substantially the same as the material of the isolation dielectric 140 is deposited and fills the trench 142. A subsequent annealing process is performed to convert the flowable dielectric material to a solid dielectric material. The filling dielectric 144 can be planarized, for example, by chemical mechanical polishing with the CMP stopping on the hard mask layer 124. The oxide layer 150 (referring to FIG. 13) can be removed in the removing process.

Unlike the cross-section shown in FIG. 9, the width of the dielectric material filled in the trench 142 shown in FIG. 14 is varied with the depth of the trench 142. For example, the width of the portion the dielectric material at the bottom of the trench 142 is narrower than the width of the portion of the dielectric material at the top of the trench 142.

In some embodiments, the dielectric liner 180, the fin residues 170, and the filling dielectric 144 filled in the trench 142 construct a dummy fin 190. The dummy fin 190 is disposed next to the active fins 120a. In some embodiments, the dummy fin 190 is regarded as the outmost fin among a group of the fins 120. Since the dielectric liner 180 is made of substantially hard material, such as silicon nitride, the strength of the dummy fin 190 is stronger than the isolation fin 120b (referring to FIG. 3). Therefore, the problem of the unwanted fin collapse or bending due to the different and non-balanced stress during the annealing process can be prevented. In some embodiments, the dummy fin 190 not only enhances the structure strength, but also blocks the moisture and oxygen from entering the device.

Figure 15:
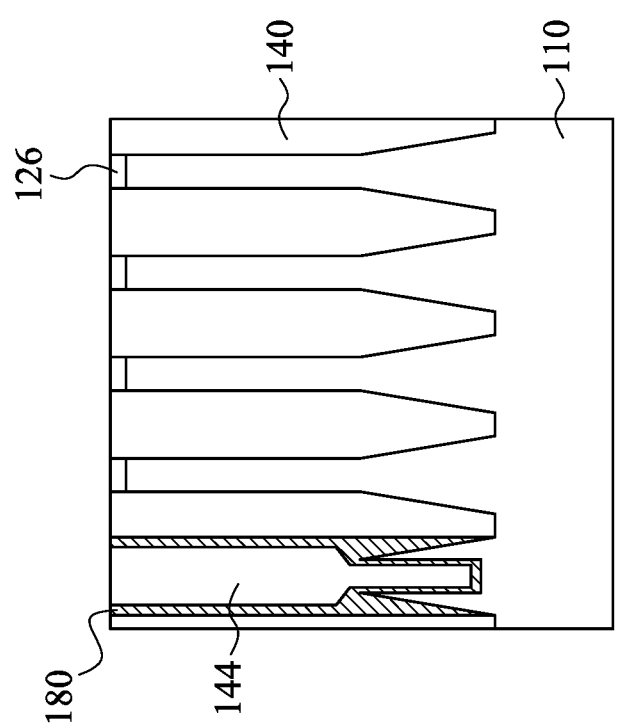

Reference is made to FIG. 15. In some embodiments, the isolation dielectric 140 and the filling dielectric 144 are etched back, and a portion of the dielectric liner 180 and the hard mask layer 124 (referring to FIG. 14) are further removed. The dielectric liner 180 and the hard mask layer 124 can be removed simultaneously. In some other embodiments, a planarization process is performed to remove the portions of the isolation dielectric 140, the filling dielectric 144, the dielectric liner 180, and the hard mask layer 124. The planarization process can be a CMP process, and the CMP process is stopped at the oxide layer 126.

Figure 16:
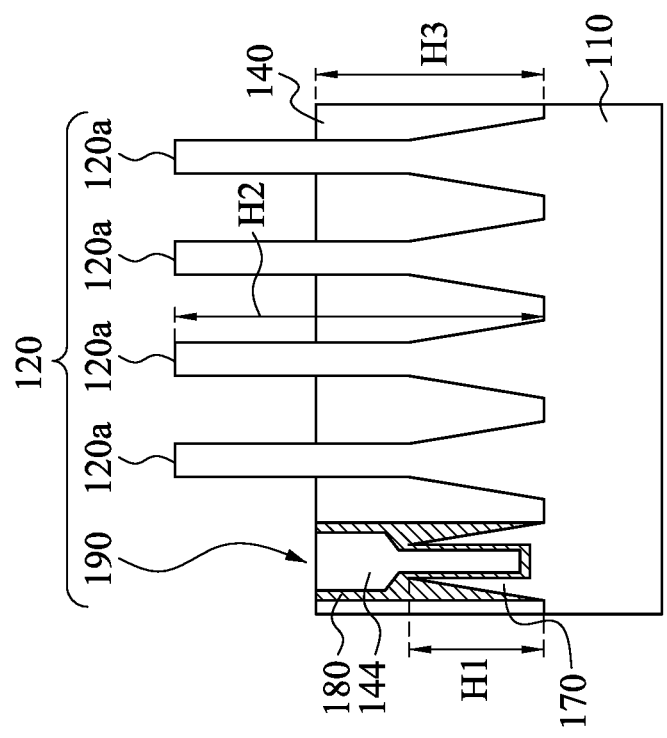

Reference is made to FIG. 16. The oxide layer 126 on the active fins 120a is removed. Portions of the isolation dielectric 140 are etched away to expose an upper portion of each of the active fins 120a. The dummy fin 190 is cut such that the dummy fin 190 is lower than the active fins 120a. In some embodiments, the height H1 of the fin residues 170 in the dummy fin 190 is in a range from about 3 nm to about 15 nm. The height H2 of the active fins 120a is about 120 nm. The thickness of the dielectric liner 180 is about 2 nm to about 5 nm. The pitch between adjacent two of the active fins 120a is less than 30 nm. The height H3 of the remaining isolation dielectric 140 is in a range from about 60 nm to about 70 nm.

In the present disclosure, the dummy fin includes the dielectric liner made of substantially hard material, such as silicon nitride, thus the strength of the dummy fin can be enhanced. Therefore, the problem of the unwanted fin collapse or bending due to the different and non-balanced stress during the annealing process can be prevented, and the reliability of the performance of the device can be improved accordingly.

According to some embodiments of the disclosure, a semiconductor structure includes a substrate, at least one active fin present on the substrate, and at least one isolation dielectric surrounding the active fin. The isolation dielectric has at least one trench therein. The semiconductor structure further includes at least one dielectric liner present on at least one sidewall of the trench of the isolation dielectric, and at least one filling dielectric present in the trench of the isolation dielectric.

According to some embodiments of the disclosure, a semiconductor structure includes a substrate, at least one active fin present on the substrate, at least one isolation dielectric surrounding the active fin and having at least one trench therein, at least a pair of fin residues present on the substrate and arranged substantially symmetrically with respect to a central axis of the trench, and at least one filling dielectric present in the trench of the isolation dielectric.

According to some embodiments of the disclosure, a method of manufacturing a semiconductor structure includes forming a plurality of fins on a substrate. At least one isolation dielectric is formed between the fins. A portion of at least one of the fins is removed, in which a pair of fin residues remain on the substrate, and a trench is formed in the isolation dielectric after the removing. A dielectric liner is further formed on at least one sidewall of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
at least one active fin present on the substrate;
at least one isolation dielectric surrounding the active fin, wherein the isolation dielectric has at least one trench therein;
at least one dielectric liner present on at least one sidewall of the trench of the isolation dielectric;
at least one filling dielectric present in the trench of the isolation dielectric, wherein the dielectric liner is in contact with the isolation dielectric and the filling dielectric; and
a fin residue between the isolation dielectric and the dielectric liner.

2. The semiconductor structure of claim 1, wherein the dielectric liner and the isolation dielectric are made of different materials.

3. The semiconductor structure of claim 1, wherein the filling dielectric and the isolation dielectric are made of substantially the same material.

4. The semiconductor structure of claim 1, wherein the dielectric liner is made of silicon nitride.

5. The semiconductor structure of claim 1, wherein the fin residue has a substantially triangle cross section.

6. The semiconductor structure of claim 1, wherein the fin residue is monolithically connected to the substrate.

7. The semiconductor structure of claim 1, wherein the fin residue is lower than the active fin.

8. The semiconductor structure of claim 1, wherein the dielectric liner is present on opposite sidewalls of the fin residue.

9. The semiconductor structure of claim 1, wherein a width of the trench is the same as a width of the active fin.

10. The semiconductor structure of claim 1, wherein the fin residue is in contact with the isolation dielectric.

11. A semiconductor structure, comprising:
a substrate;
at least one active fin present on the substrate;
at least one isolation dielectric surrounding the active fin and having at least one trench therein;
at least a pair of fin residues present on the substrate and arranged substantially symmetrically with respect to a central axis of the trench;
at least one filling dielectric present in the trench of the isolation dielectric, wherein at least one of the fin residues is between the isolation dielectric and the filling dielectric; and
a dielectric liner between the fin residues and the filling dielectric.

12. The semiconductor structure of claim 11, wherein the fin residues and the substrate are made of substantially the same material.

13. The semiconductor structure of claim 11, wherein the fin residues are lower than the isolation dielectric.

14. The semiconductor structure of claim 11, wherein the dielectric liner is present on opposite sidewalls of at least one of the fin residues.

15. The semiconductor structure of claim 11, wherein at least one of the fin residues is between the isolation dielectric and the filling dielectric.

16. The semiconductor structure of claim 11, wherein the fin residues have substantially triangle cross sections.

17. The semiconductor structure of claim 11, wherein the dielectric liner is disposed between the filling dielectric and the substrate.

18. A method of manufacturing a semiconductor structure, the method comprising:
forming a plurality of fins on a substrate;
forming at least one isolation dielectric between the fins;
removing a portion of at least one of the fins while remaining at least a pair of fin residues on the substrate, wherein at least one trench is formed in the isolation dielectric after removing the portion of the at least one of the fins;
after removing the portion of the at least one of the fins, forming a dielectric liner on at least one sidewall of the trench; and
filling a filling dielectric in the trench, wherein the dielectric liner is between and in contact with the isolation dielectric and the filling dielectric.

19. The method of claim 18, wherein the forming the dielectric liner further forms the dielectric liner on at least one sidewall of at least one of the fin residues.

20. The method of claim 18, wherein the removing exposes opposite sidewalls of at least one of the fin residues from the isolation dielectric; and
wherein the forming the dielectric liner further forms the dielectric liner on the exposed sidewalls of said at least one the fin residues.

* * * * *